Figure 1:
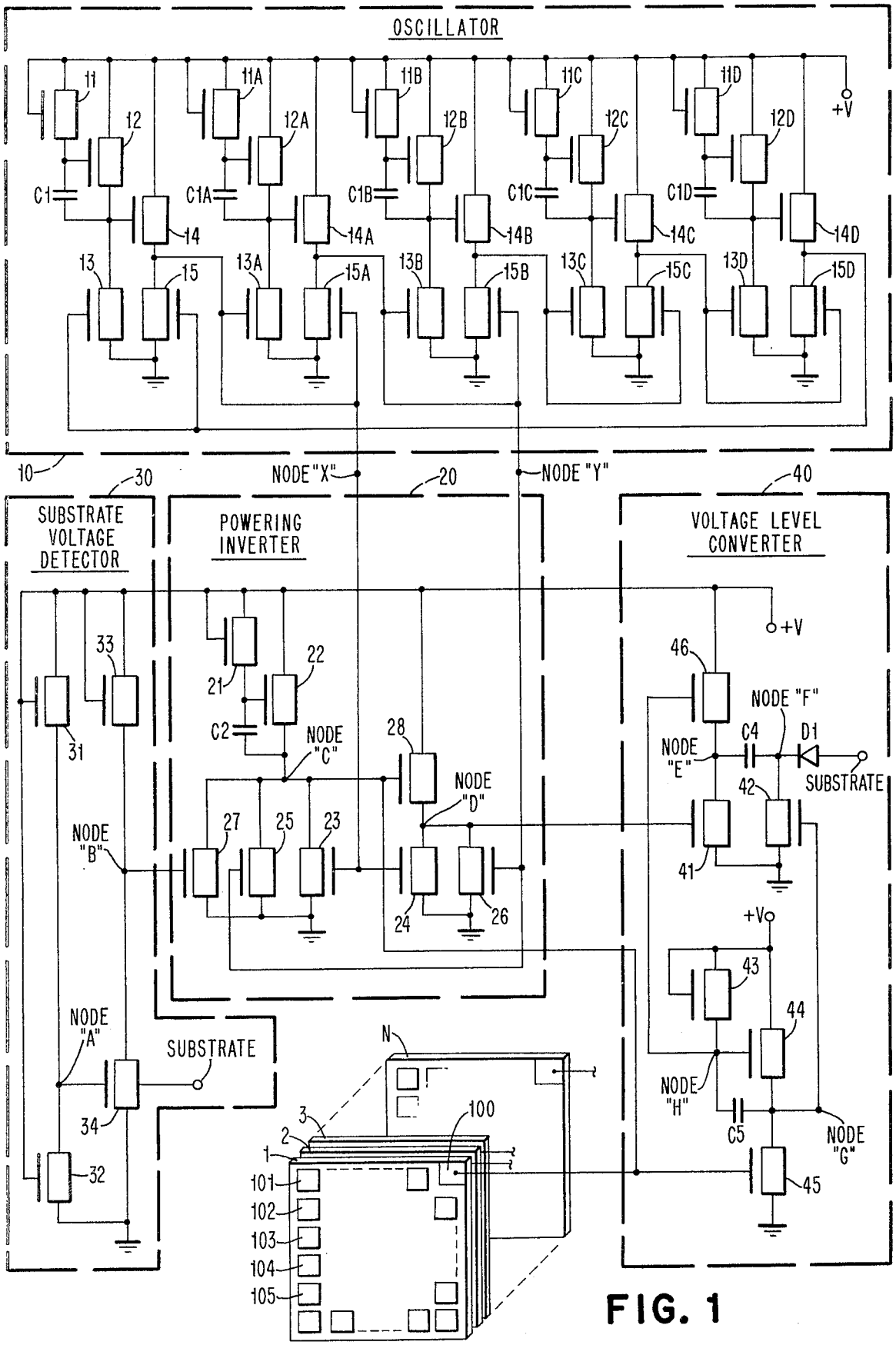
Figure 2:
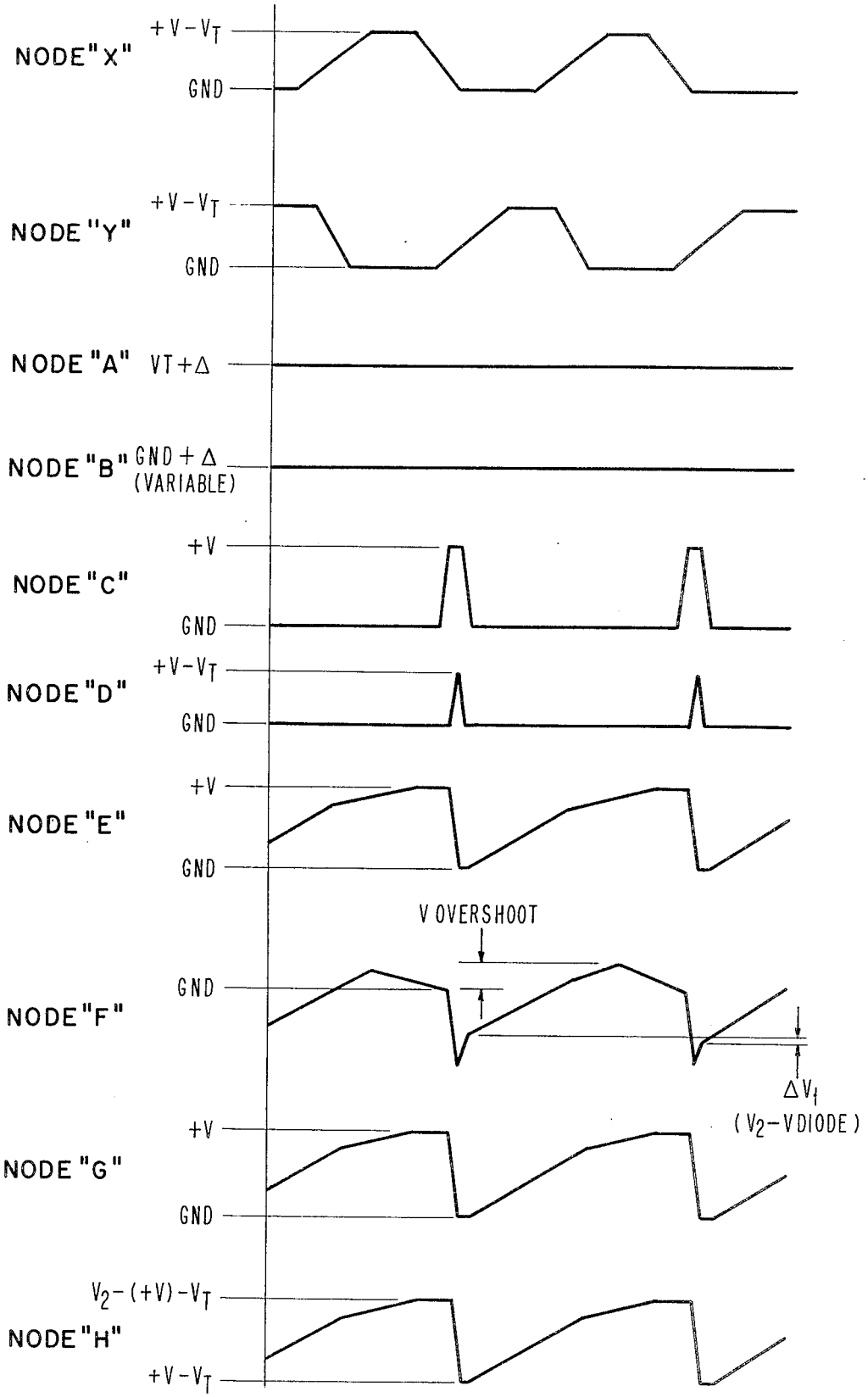

United States Defensive Publication [19] (H) [11] T954,006

Lee et al. [43] Jan. 4, 1977

[54] ON-CHIP SUBSTRATE VOLTAGE GENERATOR

[75] Inventors: James M. Lee, Wappingers Falls; George Sonoda, Poughkeepsie, both of N.Y.

[73] Assignee: International Business Machines, Armonk, N.Y.

[21] Appl. No.: 672,898

[22] Filed: Apr. 2, 1976

Related U.S. Application Data

[63] Continuation of Ser. No. 567,213, April 11, 1975, abandoned, which is a continuation of Ser. No. 375,271, June 29, 1973, abandoned.

[51] Int. Cl.[2] ..... H03K 3/353

[52] U.S. Cl. ..... 307/304; 357/41; 331/57

[57] ABSTRACT

Disclosed is an apparatus for generating and controlling a desired substrate potential level or a semiconductor chip. A pulse source, such as an oscillator, provides a pulse train which, in combination with a control signal from the substrate voltage detector, selectively discharges a capacitor in a voltage level converter for obtaining a desired level of substrate potential. A feedback path through the substrate regulates the conductivity of a reference transistor in the substrate voltage detector providing the required control signal.

1 Claim, 3 Sheets Drawing, 17 Pages Specification

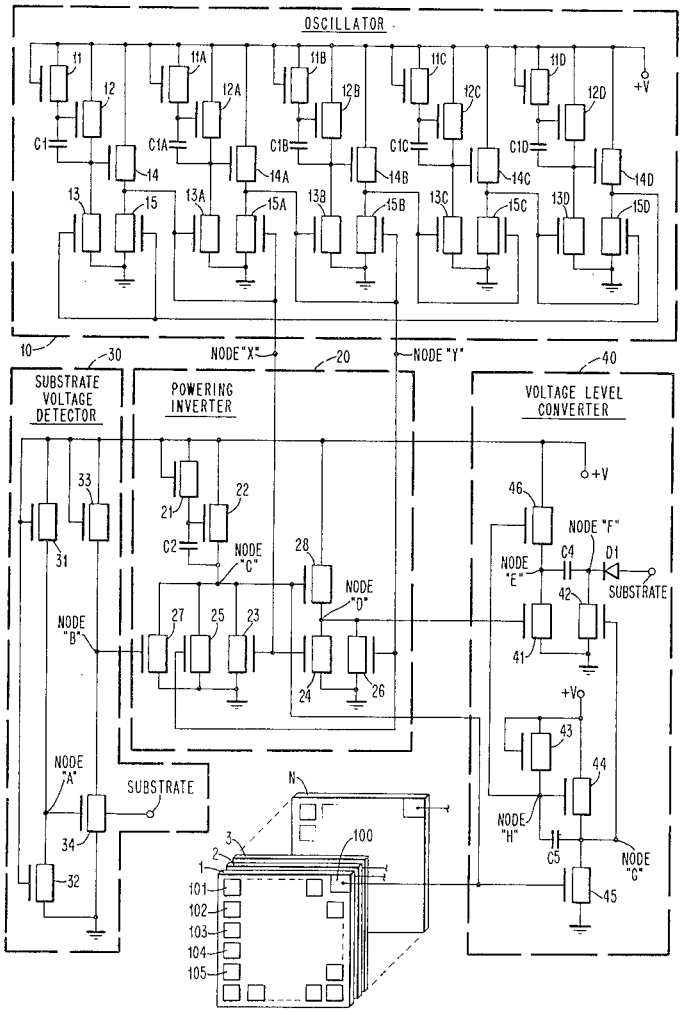

The file of this unexamined application may be inspected and copies thereof may be purchased (849 O.G. 1221, Apr. 9, 1968).